(12) United States Patent
Pascucci

(10) Patent No.: US 6,958,510 B2
(45) Date of Patent: Oct. 25, 2005

(54) PROCESS FOR FABRICATING A DUAL CHARGE STORAGE LOCATION MEMORY CELL

(75) Inventor: Luigi Pascucci, Sesto San Giovanni (IT)

(73) Assignee: STMicroelectronics S.r.l., Agrate Brianza (IT)

(*) Notice: Subject to any disclaimer, the term of this patent is extended or adjusted under 35 U.S.C. 154(b) by 92 days.

(21) Appl. No.: 10/294,999

(22) Filed: Nov. 14, 2002

(65) Prior Publication Data

US 2003/0119258 A1 Jun. 26, 2003

(30) Foreign Application Priority Data

Nov. 14, 2001 (EP) .............................. 01830700

(51) Int. Cl.[7] .............................................. H01L 27/108
(52) U.S. Cl. ..................... 257/311; 257/260; 257/261; 257/315; 257/316; 257/317
(58) Field of Search ............................... 257/260, 261, 257/311, 315, 316, 317

(56) References Cited

U.S. PATENT DOCUMENTS

| 5,714,412 | A | * | 2/1998 | Liang et al. ................. 438/266 |
| 5,923,978 | A | * | 7/1999 | Hisamune ..................... 438/264 |
| 5,949,711 | A | | 9/1999 | Kazerounian ............ 365/185.05 |
| 6,011,725 | A | | 1/2000 | Eitan ........................ 365/185.33 |
| 6,271,090 | B1 | * | 8/2001 | Huang et al. ................. 438/264 |
| 6,406,960 | B1 | * | 6/2002 | Hopper et al. ............... 438/261 |
| 6,434,053 | B1 | * | 8/2002 | Fujiwara .................. 365/185.28 |
| 6,492,228 | B2 | * | 12/2002 | Gonzalez et al. ............ 438/257 |
| 6,538,292 | B2 | * | 3/2003 | Chang et al. ................ 257/391 |

FOREIGN PATENT DOCUMENTS

WO   WO 01/17030 A1   3/2001

* cited by examiner

*Primary Examiner*—Christian Wilson
*Assistant Examiner*—Douglas Menz
(74) *Attorney, Agent, or Firm*—Lisa K. Jorgenson; Robert Iannucci; Seed IP Law Group PLLC

(57) ABSTRACT

A process for fabricating a dual charge storage location, electrically programmable memory cell, comprising: forming a first dielectric layer over a semiconductor material layer of a first conductivity type; forming a charge trapping material layer over the first dielectric layer; selectively removing the charge trapping material layer from over a central channel region of the semiconductor material layer, thereby leaving two charge trapping material layer portions at sides of the central channel region; masking the central channel region and selectively implanting dopants of a second conductivity type into the semiconductor material layer to form memory cell source/drain regions at sides of the two charge trapping material layer portions; forming a second dielectric layer over the charge trapping material layer; and forming a polysilicon gate over the second dielectric layer, the polysilicon gate being superimposed over the central channel region and the two charge trapping material layer portions.

15 Claims, 13 Drawing Sheets

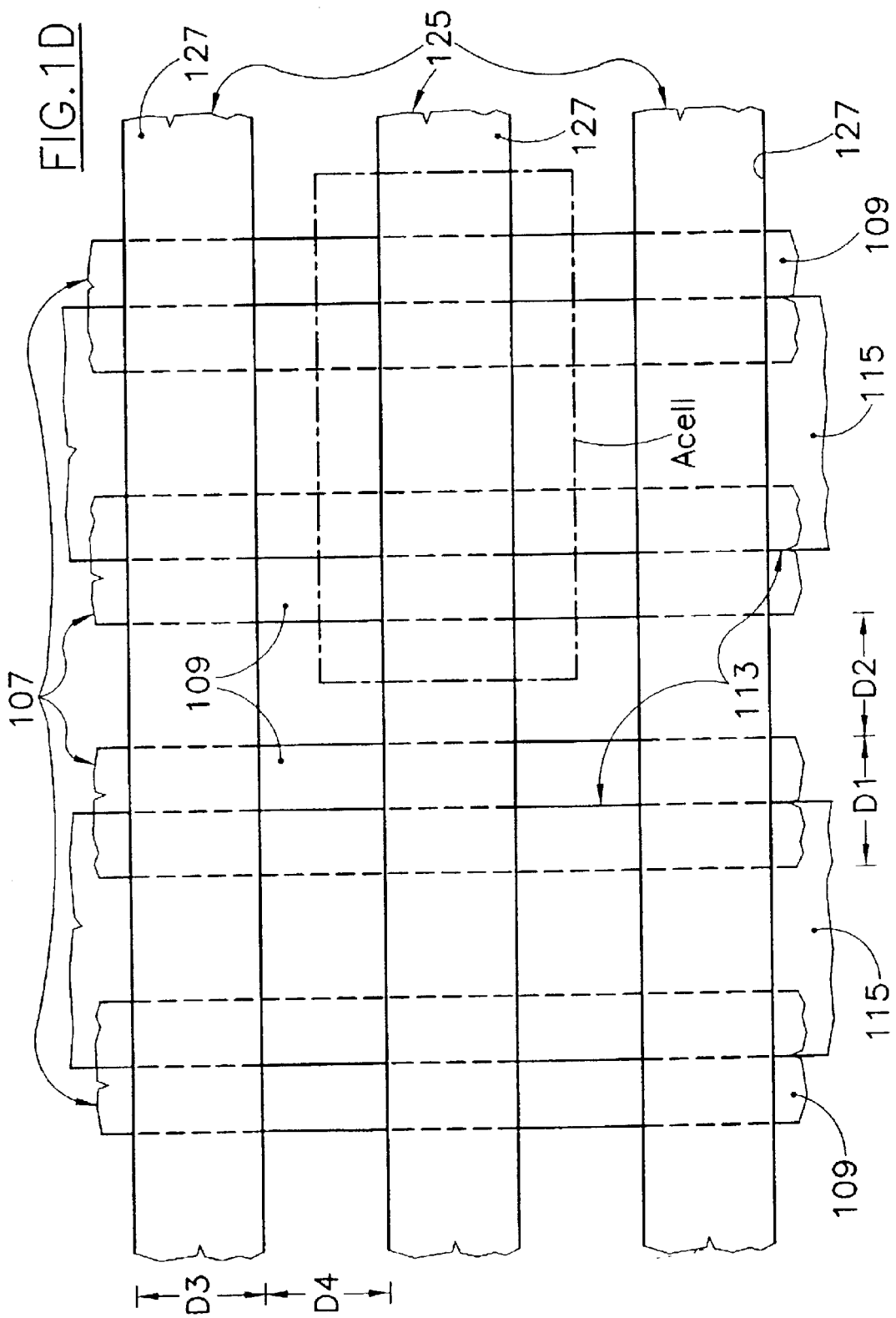

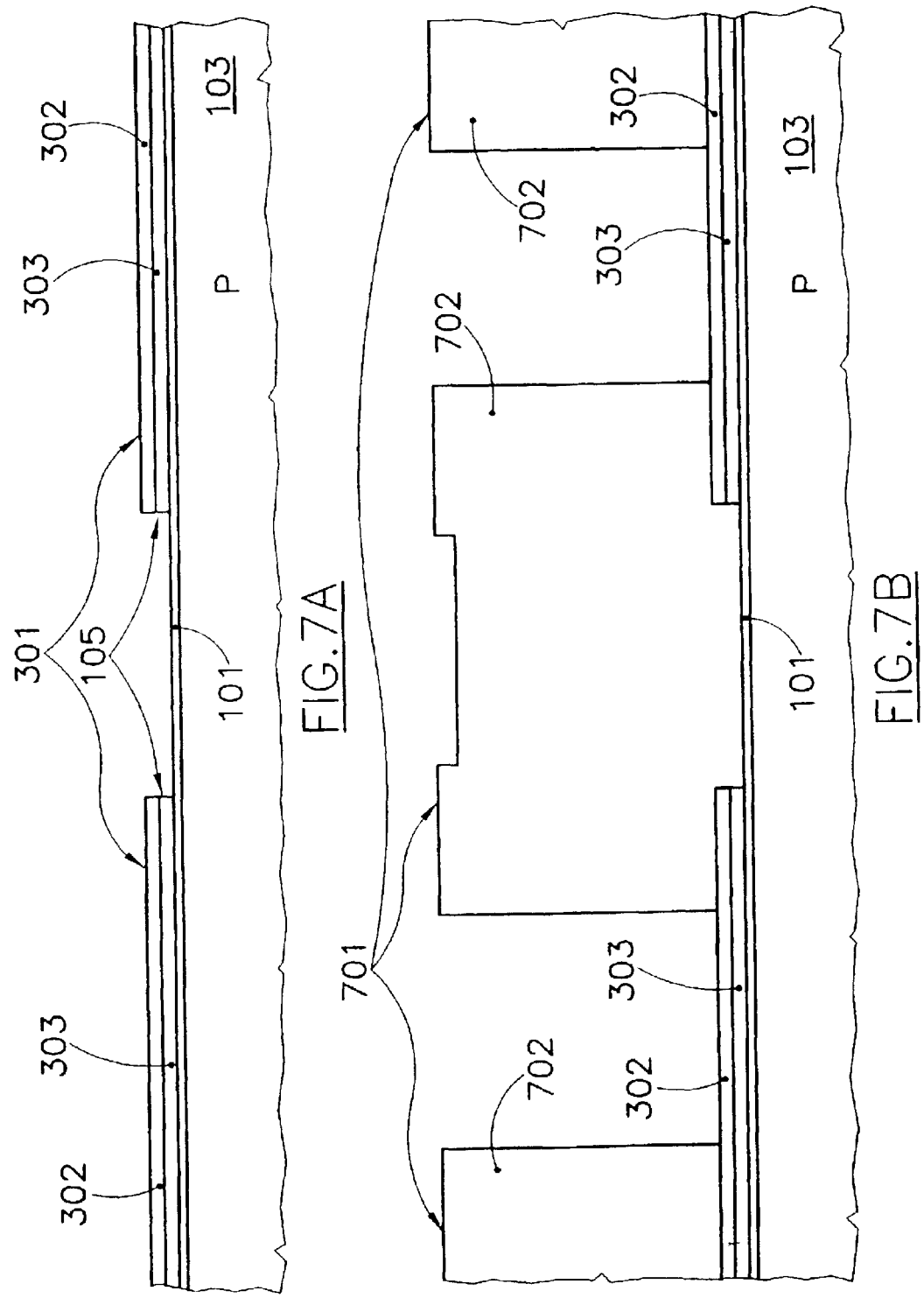

PROCESS FOR FABRICATING A DUAL CHARGE STORAGE LOCATION MEMORY CELL

BACKGROUND OF THE INVENTION

1. Field of the Invention

The present invention relates generally to the field of semiconductor memories, particularly to non-volatile memories and even more particularly to electrically programmable non-volatile memories. More specifically, the invention concerns dual charge storage location non-volatile semiconductor memory cells.

2. Description of the Related Art

As known, the information storage mechanism in non-volatile memory cells such as EPROMs, EEPROMs and Flash EEPROMs is based on the possibility of having an electric charge trapped in a charge storage element. The presence of an electric charge in the charge storage element determines a change in the memory cell threshold voltage. Such a threshold voltage change can be assessed by measuring a current sunk by the memory cell in a prescribed bias condition.

Typically, the charge storage element is represented by a polysilicon floating gate insulatively placed over the memory cell channel region and capacitively coupled to a polysilicon control gate. Charge carriers can be injected into the floating gate by means of the hot electron injection mechanism, as in EPROMs and Flash EPROMs, or by tunneling, as in EEPROMs. The presence of an electric charge in the floating gate affects the formation of a conductive channel in the channel region.

Up to some years ago; each memory cell was used to store one bit of information, corresponding to the absence (a condition conventionally interpreted as a logic "1") or the presence (logic "0") in the floating gate of an electric charge equal to or greater than a prescribed minimum amount.

The constant trend towards the increase of semiconductor memory storage capacity per unit chip area has however suggested that each memory cell could be used to store more than one bit.

Memory cells have therefore been proposed whose threshold voltage can take one of a plurality of threshold voltage levels. In such memory cells, commonly referred to as multi-level memory cells, the amount of charge trapped in the floating gate is precisely controlled and can take more than two values, for example four. To each value of electric charge there corresponds a respective threshold voltage of the memory cell. For example, a multi-level memory cell having four admissible threshold voltages is able to store two bits.

More recently, memory cells having two charge storage locations have been proposed. In these memory cells it is possible to have an electric charge trapped in two physically distinct locations of the memory cell, normally at each side of the channel region thereof, near the memory cell source/drain regions. These memory cells are therefore intrinsically adapted to store two bits.

Two types of dual charge storage location memory cells are known in the art.

A first type of dual charge storage location memory cell is described for example in U.S. Pat. No. 5,949,711, which is incorporated herein by reference in its entirety. The memory cell comprises a polysilicon control gate insulatively placed over a channel region. At both sides of the control gate, near the source/drain diffusions, two electrically isolated spacer-like elements of polysilicon form two floating gates.

Charge can be selectively injected into each floating gate and be trapped therein. Each floating gate controls a short portion of the memory cell channel.

Each one of the source/drain diffusions acts as a source electrode when reading the value of the charge trapped in the adjacent floating gate, and as a drain electrode when reading the value of the charge trapped in the opposite floating gate.

As the traditional single bit or multi-level memory cells having a single floating gate, this dual charge storage location memory cell relies for its operation on the capacitive coupling between the control gate and the two floating gates.

However, due to the physical location of the two floating gates at the sides of the control gate, the areas of coupling between the latter and the former are rather small. The capacitive coupling between the control gate and the floating gate is therefore scarce, thus allowing a small amount of charge to be injected. Additionally, from a practical viewpoint it is difficult to form the two spacer-like polysilicon floating gates at the sides of the control gate.

A second type of dual charge storage location memory cells is described for example in U.S. Pat. No. 6,011,725, which is incorporated herein by reference in its entirety. In this case the memory cell comprises a polysilicon conductive gate insulatively placed over a channel region with interposition of an oxide-nitride-oxide (ONO) stack or sandwich of layers, in which the nitride layer acts as a charge-trapping layer. Charge can be injected into and trapped in two separated and separately chargeable areas found within the nitride layer, near the memory cell source/drain regions. The latter, as in the first type of dual charge storage location memory cell described above, change their role of source/drain electrodes while reading the charge trapped in one or the other of the two areas.

Compared to the first type previously described, this dual charge storage location memory cell requires one less polysilicon layer, which simplifies the manufacturing process thereof and ensures a better reproducibility, thanks to the fact that the memory cell is highly planar. However, this structure is affected by a number of other problems, some of which will now be discussed.

In principle, the charge injected into the nitride layer should remain localized at the two sides thereof, near the charge injection regions, i.e., near the source/drain regions. The localization of the injected charge is indispensable for the memory cell to be capable of storing two bits. However, for several reasons the distribution of the charges injected into the nitride layer departs from the ideal one.

For example, during the memory cell-programming phase, the electric field, which initially (i.e., when no charges have yet been injected into the nitride layer) is favorable to the injection of charges at the sides of the nitride layer, progressively changes due to the very presence in the nitride layer of already injected charges, which have a screening effect. Consequently, the electric field progressively favors the injection and trapping of charges at the center of the nitride layer. The charges injected into one of the two chargeable areas of the nitride layer to program one of the two bits of the memory cell may even propagate to reach the opposite chargeable area, thus inducing a spurious programming of the other bit.

Additionally, during the programming phase a secondary mechanism known as CHISEL causes charges to be injected into the central portion of the nitride layer. This contributes to decreasing the localization of the injected charges. The CHISEL mechanism is enhanced by the unavoidable presence, in series to the source/drain regions of the memory cells, of parasitic resistances, which alter the memory cells effective biasing conditions. It is to be observed that normally the CHISEL mechanism is purposely exploited to limit the current consumption in programming, an important feature for memory devices which have to support a high degree of parallelism in programming, such as the memory devices for mass storage memory cards, and a real must in all those memory devices designed to operate with a Single Power Supply ("SPS"). Thus, in order to try and keep the injected charge localized, the otherwise beneficial CHISEL effect should be somehow inhibited, with a negative impact on the current consumption in programming. As a consequence, the degree of parallelism in programming has to be necessarily strongly limited, especially in SPS memory devices.

Also, phenomena of local saturation and charge redistribution effects within the nitride layer tend to reduce the localization of the charges injected into one of the two chargeable areas of the nitride layer, with a consequent spread of charges towards the central portion of the nitride layer and even towards the opposite chargeable area.

As a consequence the charges injected into one of the two chargeable areas, instead of being localized at that chargeable area, progressively tend to be delocalized in the central portion of the nitride layer, over the central portion of the memory cell channel region, and in the opposite chargeable area.

In general, these charges affect the operation of the memory cell, by modifying the threshold voltage thereof in an uncontrolled manner. The redistribution of the charges injected into one side of the nitride layer towards the central portion and towards the opposite side thereof may also cause a loss of the stored information.

The repetition of write/erase cycles exacerbates these charge redistribution effects. The distributions of threshold voltages corresponding to a programmed and to an erased bit tend therefore to spread. As a consequence, the threshold voltage shift, which the memory cell has to undergo for programming one bit, must be relatively high. This has the negative consequence of accelerating the memory cell aging, because the effects of redistribution of the injected charges are more pronounced the higher the amount of injected electric charges. The more charges are injected into one side of the nitride layer, the more charges tend to be located at the central portion and at the opposite side of the nitride layer, the more difficult is to remove the charges during the erase operation, the wider the distributions of threshold voltages. Another drawback of submitting the memory cell to a high threshold voltage shift is the need of applying to the memory cell drain region a relatively high potential for a relatively long period of time: this has a soft erase effect on the memory cells belonging to the same column of the memory cell array as the memory cell under programming.

Additionally, the poor control of the amount of charges trapped in the useful positions of the nitride layer, together with the need of having a high threshold voltage shift for making a programmed bit distinguishable from an erased one, prevents from trying to increase the storage capacity by adopting a multi-level approach. Even worse, due to their position, the charges located in the central portion of the nitride layer are hardly removed during the memory cell-erasing phase. This means that the amount of charges trapped in the central portion of the nitride layer tends to rapidly increase with the number of program/erase cycles to which the memory cell is submitted. This causes a rapid increase of the time needed to erase the memory cell, up to a condition such that the memory cell cannot be erased any more.

It is to be observed that the above problems become more serious the smaller the memory cell dimensions, and therefore pose a limitation to the memory cell shrinkage.

In U.S. Pat. No. 6,248,633 B1, which is incorporated herein by reference in its entirety, a dual bit memory cell with a twin MONOS structure is disclosed. The memory cell comprises two polysilicon sidewall control gates placed over a composite ONO stack at both sides of a polysilicon word gate. The latter is placed over a gate oxide layer.

The nitride layer within the ONO stack that is under each sidewall control gate is the region for electron memory storage. Since the two nitride layer regions under the two sidewall control gates are physically separated from each other, this structure appears not to be affected by the problem of charge confinement previously discussed.

However, the various processes for manufacturing the MONOS dual charge storage location memory cell described in this document appear rather complicated. For example, use is made of disposable polysilicon sidewall spacers to fabricate the memory cell channel, which increases the process steps.

BRIEF SUMMARY OF THE INVENTION

An embodiment of the present invention provides a process for fabricating a dual charge storage location memory cell which is simple and which allows obtaining a memory cell not affected by the problems discussed above.

In brief, the process comprises the steps of:

forming a first dielectric layer over a semiconductor material layer of a first conductivity type;

forming a charge trapping material layer over the first dielectric layer;

selectively removing the charge trapping material layer from over a semiconductor material layer region intended to act as a central channel region for the memory cell, leaving two charge trapping material layer portions at the sides of the central channel region;

masking the central channel region and selectively implanting dopants of a second conductivity type into the semiconductor material layer to form memory cell source/drain regions at the sides of the two charge trapping material layer portions;

forming a second dielectric layer over the charge trapping material layer; and forming a polysilicon gate over the second dielectric layer, the polysilicon gate being superimposed over the central channel region and the two charge trapping material layer portions.

BRIEF DESCRIPTION OF THE SEVERAL VIEWS OF THE DRAWING(S)

The features and advantages of the present invention will be made apparent by the following detailed description of some embodiments thereof, provided merely by way of non-limitative examples with reference to the attached drawings, wherein:

FIGS. 1A, 1B and 1C are cross-sectional views showing the main steps of a fabrication process according to a first embodiment of the present invention;

FIG. 1D schematically shows a superposition of the main process masks used in the process of FIGS. 1A, 1B and 1C;

Figure 5:
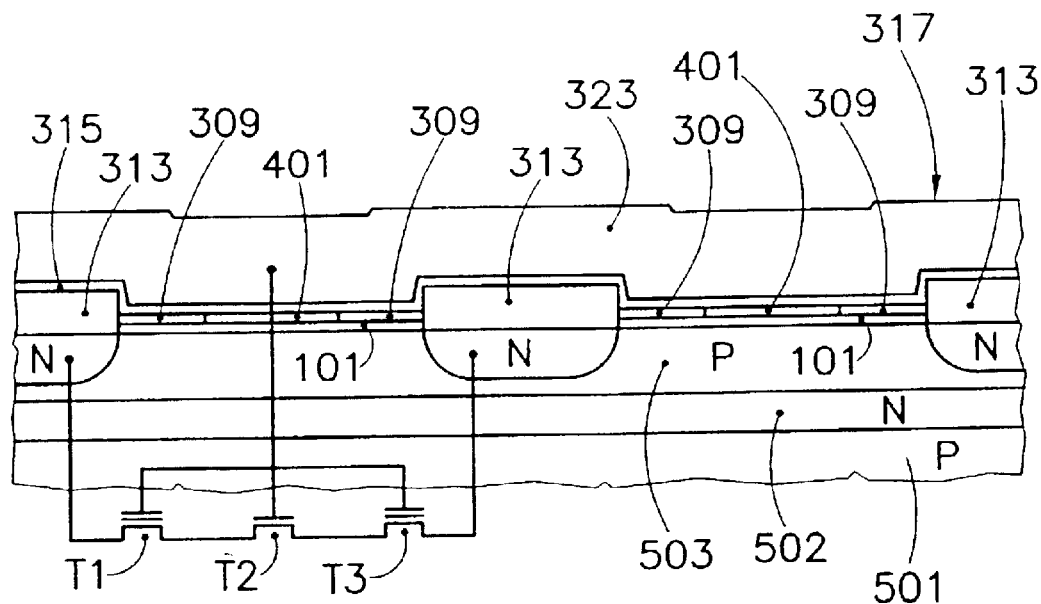
Figure 3A:
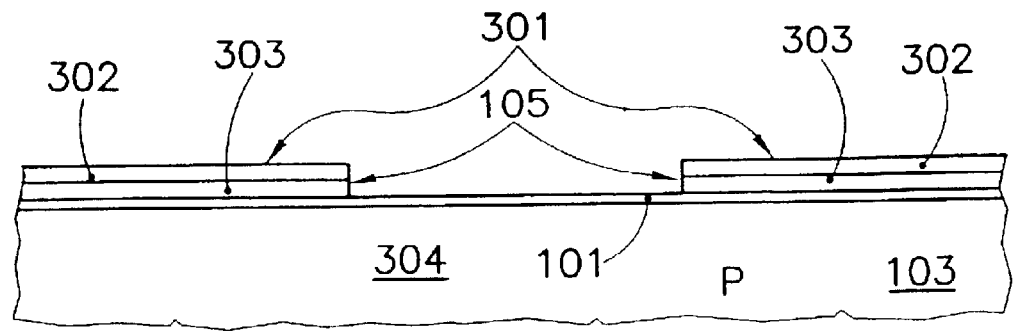
FIGS. 3A to 3F are cross-sectional views showing the main steps of a fabrication process according to a third embodiment of the present invention.
Figure 3B:
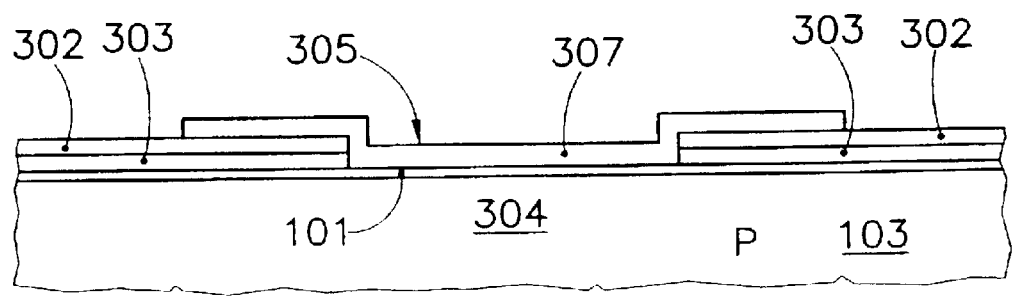
Figure 3C:
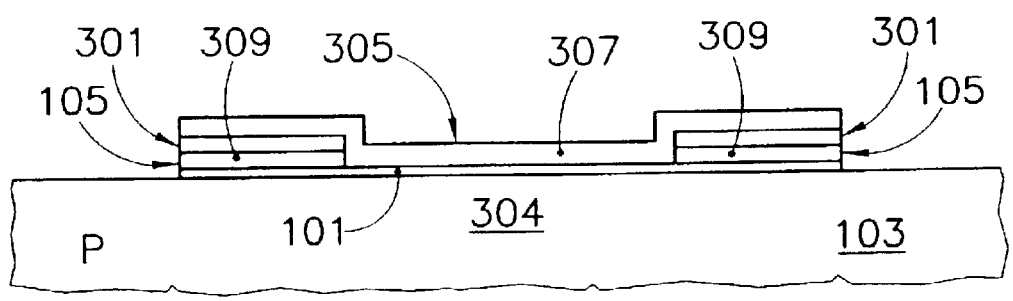
Figure 3D:
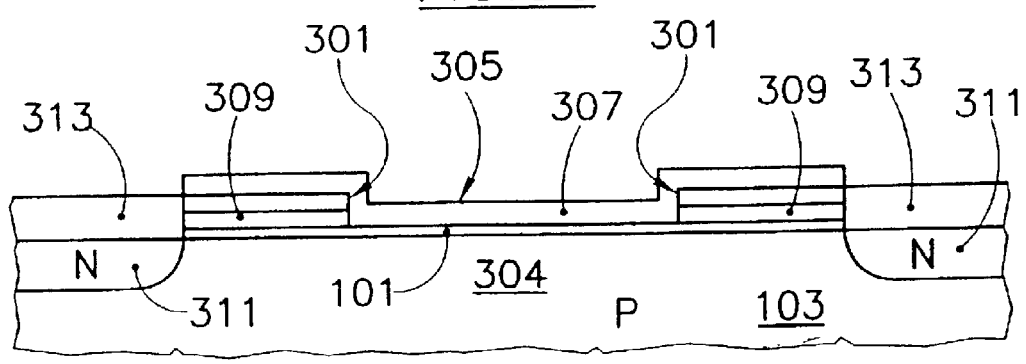
Figure 3E:
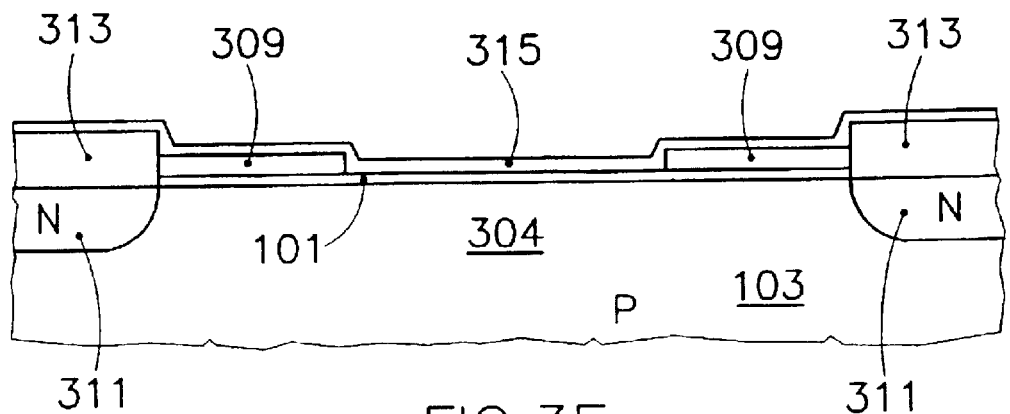
Figure 3F:
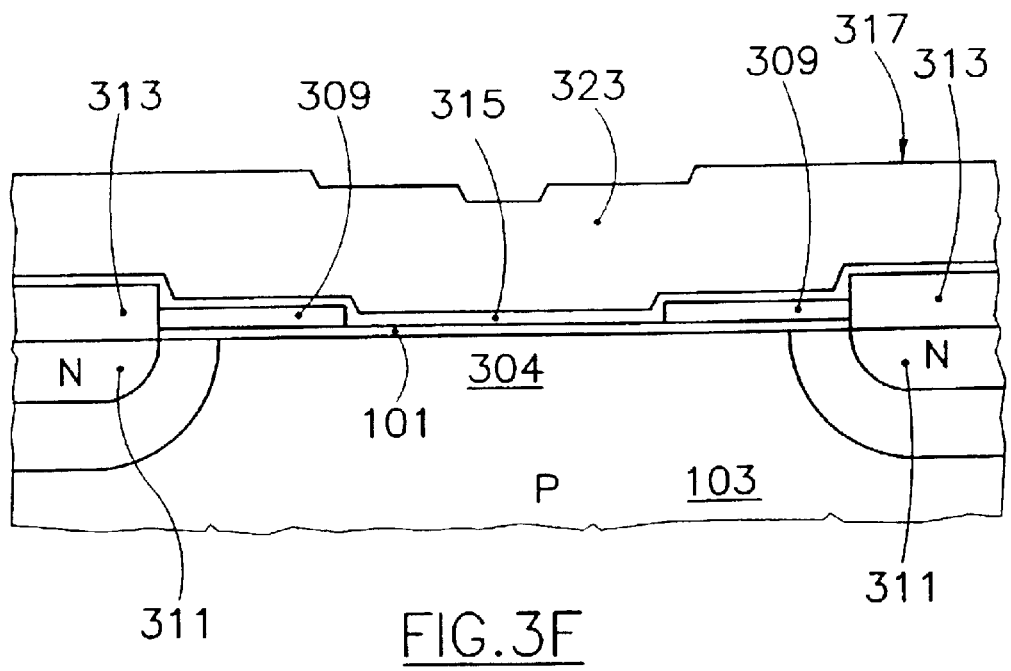
Figure 3G:
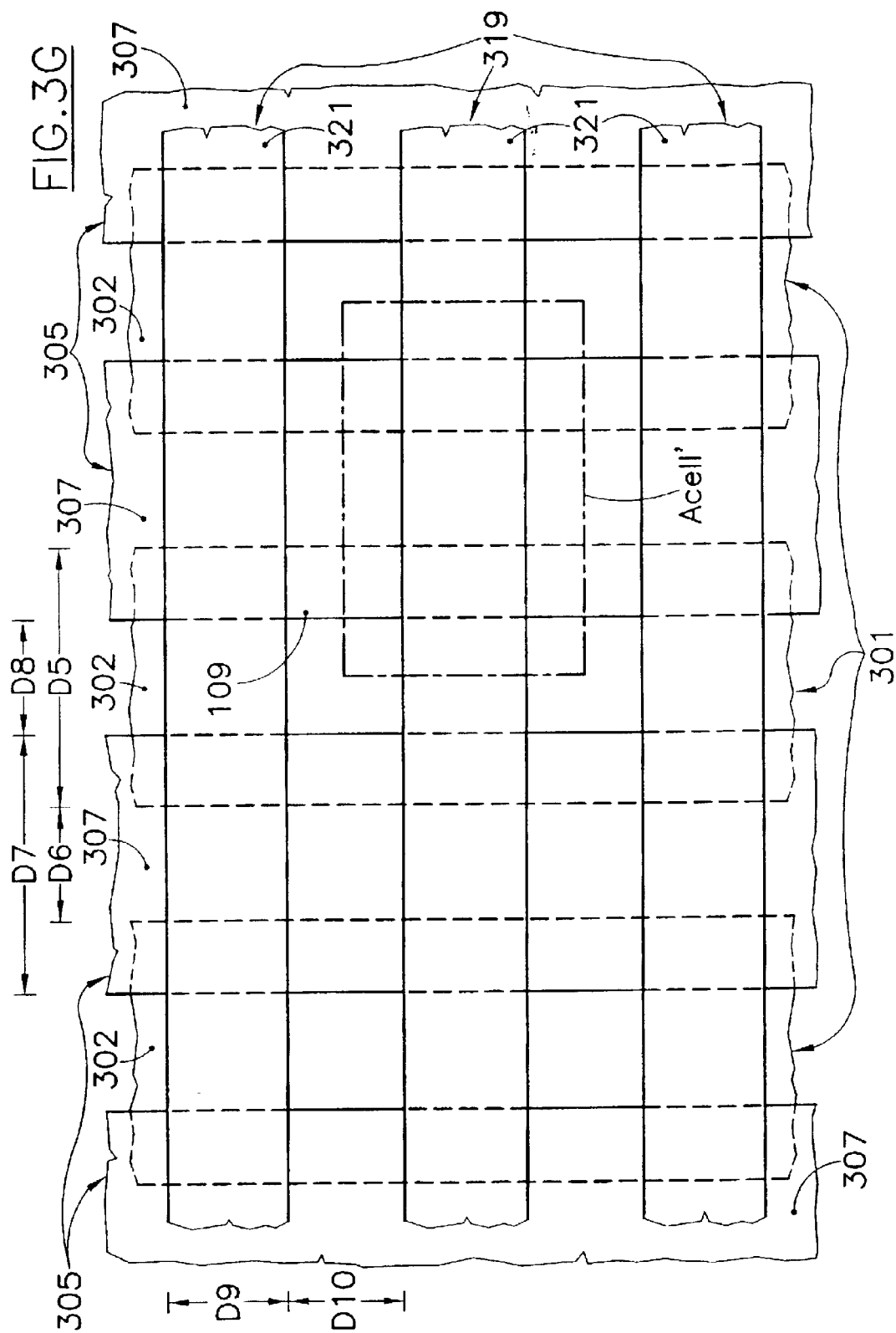
Figure 6:
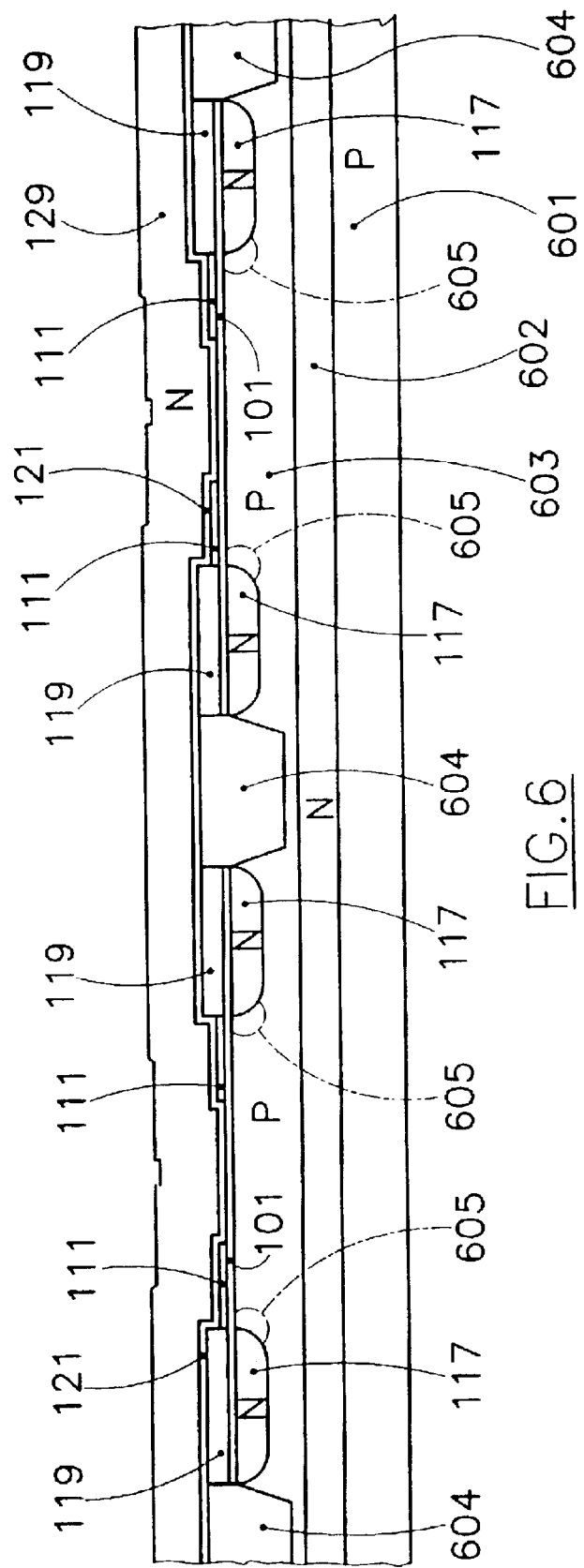

FIG. 3G schematically shows a superposition of the main process masks used in the process of FIGS. 3A to 3F;

FIGS. 4A to 4G are cross-sectional views showing the main steps of a fabrication process according to a fourth embodiment of the present invention;

FIG. 5 is a cross-sectional view of a triple well EPROM or Flash EPROM memory cell structure obtainable by means of a process according to the present invention;

FIG. 6 is a cross-sectional view of a triple well EEPROM memory cell structure obtainable by means of a process according to the present invention; and FIGS. 7A to 7D are cross-sectional views showing the main steps of a fabrication process according to still another embodiment of the present invention.

DETAILED DESCRIPTION OF THE INVENTION

In the following, same reference numerals will be adopted to identify same parts in the different embodiments that will be described.

The embodiments of the invention that will be described relate to the fabrication of a so-called contact-less array of memory cells. This is a memory cell array architecture in which no electrical contacts to the source/drain regions of the memory cells are provided within the array. The bit lines of the array are formed by doped regions extending across the array, contacted by metal bit lines in prescribed areas outside the array.

However, albeit the advantages that a contact-less memory cell array allows to achieve in terms of compactness, the present invention shall not be intended as limited to such an array structure, being applicable to different array structures such as the traditional one with metal bit lines and contacts to the memory cells source/drain regions inside the array.

Figure 1A:
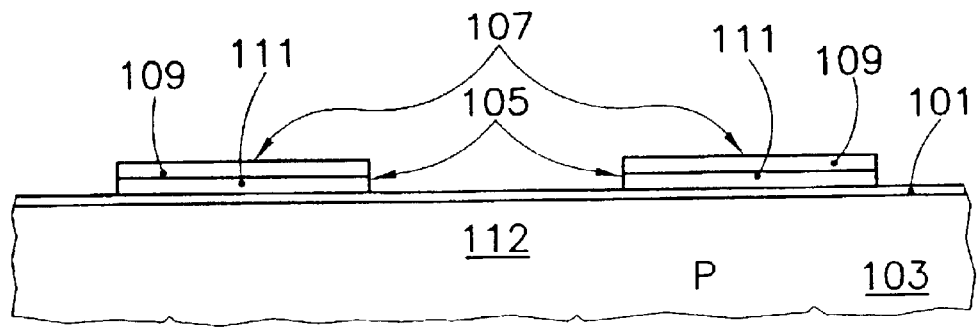
Figure 1B:
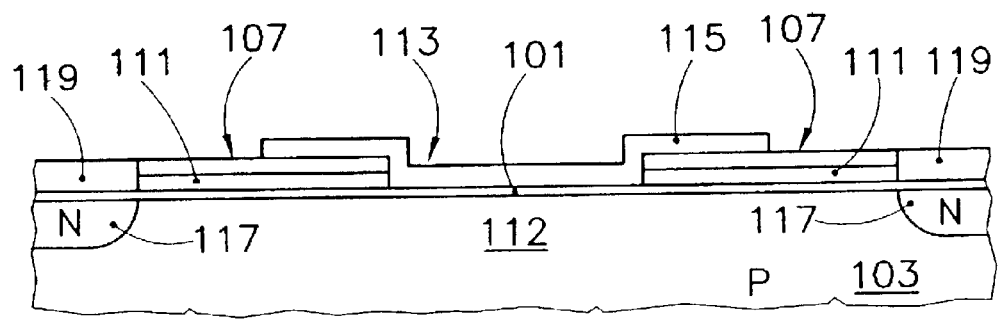
Figure 1C:
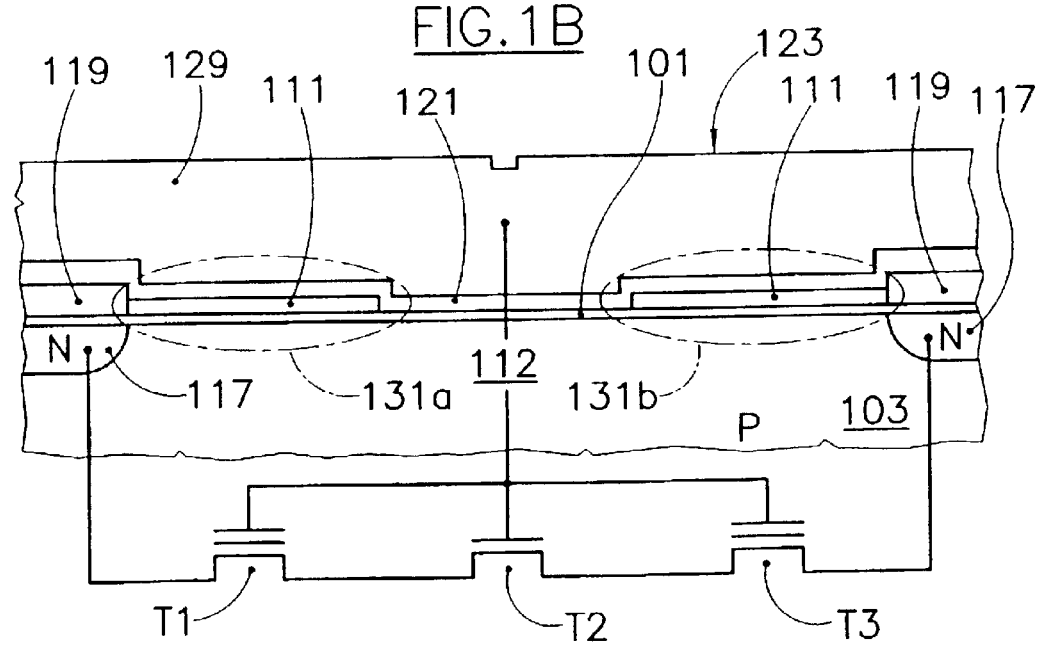

Referring to FIGS. 1A, 1B and 1C, the main steps of a fabrication process according to a first embodiment of the present invention are shown in terms of cross-sectional views. More specifically, these figures show in cross-section a portion of an array of EPROM or Flash EPROM memory cells. FIG. 1D shows instead in top-plan view a superposition of the three main masks used in the fabrication process. With reference to FIG. 1A, a silicon dioxide ($SiO_2$) layer 101 is formed on a surface of a semiconductor substrate 103, for example doped of the P conductivity type. A layer 105 of silicon nitride ($Si_3N_4$) is then formed by conventional techniques on the silicon dioxide layer 101. After the formation of the nitride layer 105, a first etch mask 107 is formed by conventional photolithographic techniques on the nitride layer 105, and an etch process is performed for selectively removing the nitride layer 105. In particular, as visible in FIG. 1D, the first etch mask 107 comprises a plurality of stripes 109 of equal width D1, extending parallel to each other in a first direction (the vertical direction in the drawing) and regularly spaced from each other of a distance D2. By means of the first etch mask 107, the etch process leads to the formation of stripes 111 of silicon nitride. The silicon nitride stripes 111, just as the stripes 109 of the first etch mask 107, have all equal width D1, extend parallel to each other in the first direction and are regularly spaced from each other of the distance D2. Regions 112 of the substrate 103 between alternate pairs of adjacent nitride stripes 111 will form central channel regions of the memory cells.

With reference to FIG. 1B, an implant mask 113 is then formed by conventional photolithographic techniques over the structure. Referring jointly to FIG. 1D, the implant mask 113 comprises a plurality of stripes 115 each one covering a respective substrate region 112 and at least partially overlapping the pair of adjacent nitride stripes 111 between which the substrate regions 112 are comprised. N type dopants are then implanted into the substrate 103 in exposed regions thereof, that is, in the substrate regions comprised between adjacent nitride stripes 111 and not covered by the implant mask 113. The implanted dopants form elongated N type regions 117 extending parallel to each other and to the nitride stripes 111, self-aligned with the latter. The N type regions 117 will form bit lines of the array of memory cells. A layer 119 of silicon dioxide of suitable thickness is then formed over the N type regions 117.

Referring now to FIG. 1C, the implant mask 113 and the first etch mask 107 are then removed. A further layer 121 of silicon dioxide is formed over the structure; in particular, the silicon dioxide layer 121 placed over the nitride layer 105 forms, together with the nitride layer 105 and the underlying silicon dioxide layer 101, an oxide-nitride-oxide ("ONO") sandwich, in which the nitride acts as a charge storage element. A layer 123 of polysilicon is then formed over the structure. A second etch mask 125 is formed by conventional photolithographic techniques over the polysilicon layer 123. As shown in FIG. 1D, the second etch mask 125 comprises a plurality of stripes 127 of equal width D3, extending parallel to each other in a second direction (the horizontal direction in the drawing), transverse to the first direction, and regularly spaced from each other of a distance D4. An etch process is then carried out for selectively removing the polysilicon layer 123 where it is not protected by the second etch mask 125. The etch process leads to the formation of a plurality of polysilicon stripes 129 constituting the word lines of the memory cell array and, at the same time, the gates of the memory cells. The word lines 129, just as the stripes 127 of the second etch mask 125, have all equal width D3, extend parallel to each other in the second direction and are regularly spaced from each other of the distance D4.

As visible in FIG. 1C, each memory cell comprises two physically separated ONO sandwich portions 131a, 131b, with physically separated nitride layer portions, each one located near a respective N type region 117, i.e. adjacent a respective bit line of the memory cell array. The nitride layer is instead absent over the central channel region 112 of the memory cell.

Functionally, the memory cell is equivalent to three MOS transistors T1, T2, T3 connected in series between the two bit lines 117. The lateral transistors T1 and T3, each one adjacent a respective bit line 117, have each a control gate, formed by the word line 129, and a charge storage element, formed by the respective nitride layer portion 111. The central transistor T2 is a normal MOSFET, having a gate formed by the word line 129, a gate oxide formed by the superposition of the two silicon dioxide layers 101 and 121 and a channel formed by the substrate region 112.

By applying suitable voltages to the word line and to the bit lines, electrons can be selectively injected into the physically separated portions of the nitride layer and be trapped therein. For example, in order to inject electrons into the nitride layer portion 111 of the ONO sandwich portion 131a so as to write the left-hand lateral transistor T1 of the memory cell, the bit line 117 opposite thereto (acting as a memory cell source electrode in the programming phase) is kept to a reference voltage (ground), while sufficiently high positive voltages are applied to the bit line 117 adjacent the ONO sandwich portion 131a (acting as a memory cell drain electrode) and to the word line 129. Electrons can be removed from the same nitride layer portion 111 by applying a sufficiently high positive voltage to the adjacent bit line 117, while keeping the word line 129 grounded and leaving the opposite bit line floating. The programming state of the left-hand lateral transistor T1 can be sensed by keeping the adjacent bit line (acting as the memory cell source electrode in reading) to the reference voltage, while applying positive voltages (lower than those used for programming) to the opposite bit line (acting as the memory cell drain electrode in programming) and to the word line.

Each one of the two lateral transistors T1 and T3 can store different amounts of charge, so as to combine the advantages of a dual charge storage location memory cell with those of a multi-level memory cell.

Figure 2A:
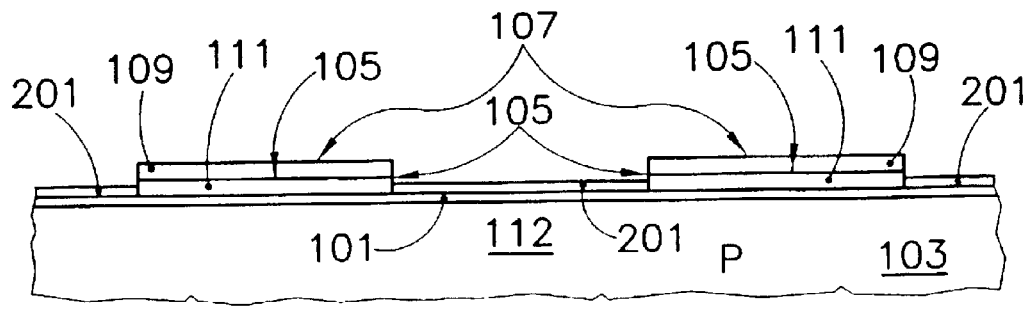
FIGS. 2A to 2E are cross-sectional views showing the main steps of a fabrication process according to a second embodiment of the present invention.

FIGS. 2A to 2E are cross-sectional views of a portion of an array of EPROM or Flash EPROM memory cells showing the main steps of a fabrication process according to a second embodiment of the present invention. With reference to FIG. 2A, similarly to the previous embodiment, the silicon dioxide layer 101 is formed on the surface of the semiconductor substrate 103, the layer 105 of silicon nitride is formed on the silicon dioxide layer 101, the first etch mask 107 is formed on the silicon nitride layer 101 and an etch process is carried out for selectively removing the nitride layer 105, leading to the formation of the nitride stripes 111. At this point, a further silicon dioxide layer 201 is formed. The silicon dioxide layer 201 increases the thickness of the silicon dioxide layer 101 over the substrate 103.

Figure 2B:
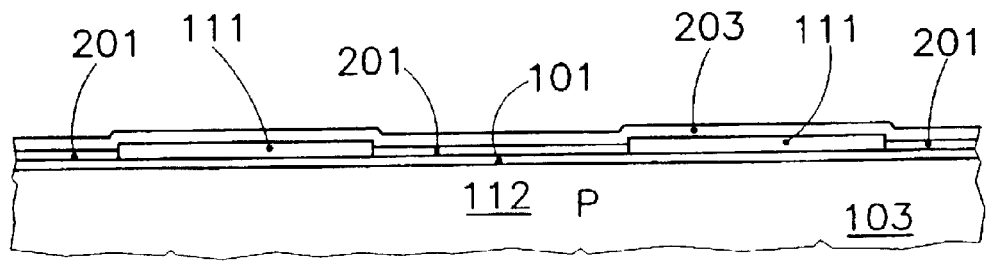

Referring now to FIG. 2B, the first etch mask 107 is then removed, and a silicon dioxide layer 203 is formed on the structure; the silicon dioxide layer 203 over the nitride layer stripes 111 completes the oxide-nitride-oxide ("ONO") sandwich.

Figure 2C:
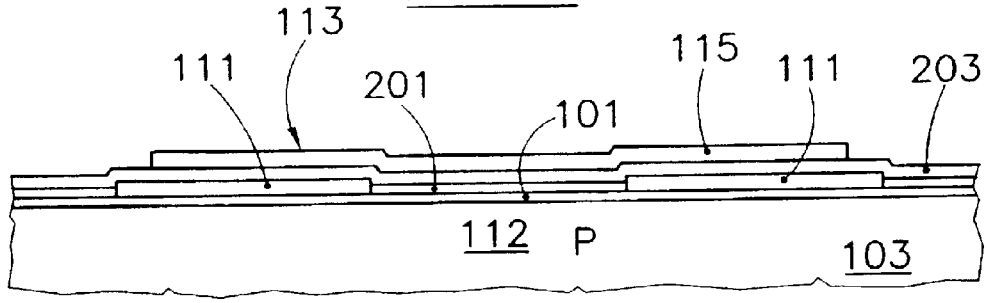
Figure 2D:
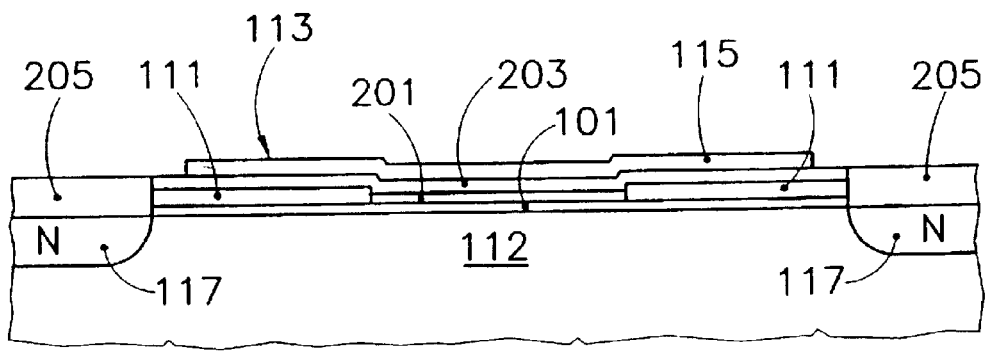
Figure 2E:
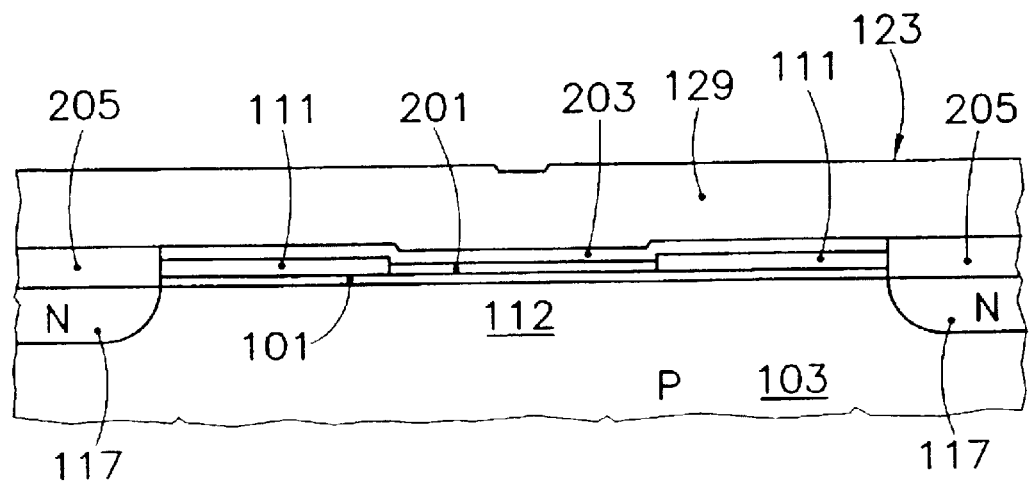

With reference to FIG. 2C, the implant mask 113 is then formed for protecting the substrate regions 112 from the implant of the N type dopants that leads to the formation of the N type regions 117, shown in FIG. 2D2 A further oxidation process is performed, to increase the oxide thickness over the N type regions 117 (the stack of different oxide layers thereover being depicted for simplicity as a single layer indicated by 205 in FIGS. 2D and 2E).

Referring finally to FIG. 2E, the implant mask 113 is then removed. The layer 123 of polysilicon is then formed over the structure and, by means of the second etch mask 125 shown in FIG. 1D, the polysilicon layer 123 is selectively removed to form the plurality of polysilicon stripes 129 constituting the word lines of the memory cell array and, at the same time, the gates of the memory cells.

With respect to the first embodiment, the process according to the second embodiment of the invention allows to obtain memory cells having a thicker layer of silicon dioxide over the central channel region. Thanks to this, the electric field which develops in the memory cell programming phase in correspondence of the central channel region is reduced, and is instead increased in correspondence of the memory cell drain region, so that the charge injection mechanism tends to concentrate at the edges of the nitride layer near the bit lines 117. This improves the localization of the charge trapped in the nitride layer, preventing one of the two memory cell lateral transistors T1, T2 from being spuriously written during the programming of the opposite lateral transistor. By varying the thickness of the silicon dioxide layer 201 it is thus possible to modulate the electric field independently of the thickness of the silicon dioxide layer 101. The silicon dioxide layer 101 cannot in fact be made too thick not to reduce the efficiency of the electron injection mechanism into the nitride layer portions 111.

The two process embodiments described up to now allows forming memory cells each having an area equal to:

$$Acell=2(D1+D2)*(D3+D4).$$

The area occupied by one memory cell is schematically depicted in dash-and-dot line in FIG. 1D, wherein it is indicated by Acell.

Each one of the dimensions D1, D2, D3 and D4 can be shrinked down to the minimum feature size F allowed by the photolithographic apparatus, so that the minimum memory cell area achievable by means of the process embodiments described so far is:

$$(Acell)min=8F^2.$$

For a minimum feature size F of 0.18 $\mu$m, the memory cell area (Acell)min is equal to 0.26 $\mu$m$^2$. This means that the area per bit is equal to 0.13 $\mu$m$^2$. The area per bit can be further reduced if a multi-level approach is additionally implemented: assuming that each charge storage location of a memory cell (i.e., each one of the two physically separated portions of nitride layer) is exploited to store two bits instead of a single one, the memory cell is then capable of storing four bits, which means that the area per bit falls to 0.065 $\mu$m$^2$. If the photolithographic apparatus allows achieving a minimum feature size F of 0.13 $\mu$m, then the memory cell area (Acell)min is equal to 0.135 $\mu$m$^2$. This means that the area per bit is equal to 0.068 $\mu$m$^2$ in a two-bit memory cell, and to 0.034 $\mu$m$^2$ in a four-bit memory cell.

In the foregoing, two processes according to further embodiments of the present invention will be described which allow obtaining a more compact memory cell.

Referring to FIGS. 3A to 3F, the main steps of a fabrication process according to a third embodiment of the present invention are shown in terms of cross-sectional views of a portion of an array of EPROM or Flash EPROM memory cells. FIG. 3G shows instead in top-plan view a superposition of the three main masks used in the fabrication process. With reference to FIG. 3A, after having formed the silicon dioxide layer 101 on the surface of the semiconductor substrate 103 and having formed the layer 105 of silicon nitride on the silicon dioxide layer 101, a first etch mask 301 is formed by conventional photolithographic techniques on the nitride layer 105, and an etch process is carried out. As better visible in FIG. 3G, the first etch mask 301 comprises a plurality of stripes 302 of equal width D5, extending parallel to each other in a first direction (the vertical direction in the drawing) and regularly spaced from each other of a distance D6. By means of the first etch mask 301, the etch process leads to the formation of stripes 303 of silicon nitride. The silicon nitride stripes 303, just as the stripes 302 of the etch mask, have all equal width D5, extend parallel to each other in the first direction and are regularly spaced from each other of the distance D6. Regions 304 of the substrate 103 between alternate pairs of the adjacent nitride stripes 303 will form central channel regions of the memory cells.

Referring to FIG. 3B, a second etch mask 305 is formed by conventional photolithographic techniques. As shown in FIG. 3G, the second etch mask 305 comprises as well a plurality of stripes 307 of equal width D7, extending parallel to each other in the first direction and regularly spaced from each other of a distance D8. The stripes 307 cover the regions 304 of the substrate 103, and partially overlaps the underlying first etch mask stripes 302 and nitride stripes 303.

With reference to FIG. 3C, an etch process is then carried out suitable to remove the first etch mask 301 and the nitride layer 105, where the latter are not protected by the second etch mask 305. The etch process leads to the formation of narrower nitride stripes 309 from the nitride stripes 303 previously formed, the width of the narrower nitride stripes 309 being equal to the overlap of the second etch mask stripes 307 on the first etch mask stripes 302.

With reference to FIG. 3D, an N type dopant is then implanted into the substrate 103, the second etch mask 305 acting also as an implant mask for the dopants. In this way, while the central channel substrate regions 304 are protected against the introduction of dopants, N type regions 311 are formed between alternate adjacent pairs of narrower nitride stripes 309. The N type regions 311, which extend parallel to each other in the first direction, will form bit lines of the memory cell array.

Still referring to FIG. 3D, a layer 313 of silicon dioxide is formed over the N type regions 311.

Then, as shown in FIG. 3E, the first and second etch masks 301 and 305 are removed, and a layer 315 of silicon dioxide is formed over the structure. Over the nitride layer, the silicon dioxide layer 315 completes the ONO sandwich.

Referring finally to FIG. 3F, a layer 317 of polysilicon is formed over the silicon dioxide layer 315. As shown in FIG. 3G, a third etch mask 319 is formed by conventional photolithographic techniques over the polysilicon layer 317. The third etch mask 319 comprises a plurality of stripes 321 of equal width D9, extending parallel to each other in a second direction (the horizontal direction in the drawing), transverse to the first direction, and regularly spaced from each other of a distance D10. An etch process is then carried out to selectively remove the polysilicon layer 317 where it is not protected by the etch mask 319. The etch process leads to the formation of a plurality of polysilicon stripes 323 constituting the word lines of the memory cell array and, at the same time, the gates of the memory cells. The word lines 323, just as the stripes 321 of the third etch mask 319, all have equal width D9, extend parallel to each other in the second direction and are regularly spaced from each other of the distance D10.

The process according to the third embodiment of the invention allows forming memory cells having each one an area equal to:

$$Acell'=(D5+D6)*(D9+D10).$$

The area occupied by one memory cell is schematically depicted in dash-and-dot line in FIG. 3G, wherein it is indicated by Acell'.

Each one of the dimensions D6, D9 and D10 can be shrinked down to the minimum feature size F allowed by the photolithographic apparatus. If the dimension D5 is shrinked down to twice the minimum feature size, 2F, the memory cell area is:

$$(Acell')min=6F^2$$

that is, an area smaller than that achievable by the processes according to the first two embodiments. In this case, since the pitch D5+D6 of the stripes 302 of the first etch mask 301 must be equal to the pitch D7+D8 of the stripes 307 of the second etch mask 305, the dimension D8 can be shrinked down to the minimum feature size F, so that the width D7 of the stripes 307 is equal to twice the minimum feature size 2F. By way of comparison, for a minimum feature size F of, respectively, 0.18 $\mu$m and 0.13 $\mu$m, the memory cell area (Acell')min is equal to 0.195 $\mu m^2$ and 0.101 $\mu m^2$.

FIGS. 4A to 4G are cross-sectional views of a portion of an array of memory cells showing the main steps of a fabrication process according to a fourth embodiment of the present invention, with slight variations with respect to the third embodiment.

Figure 4A:
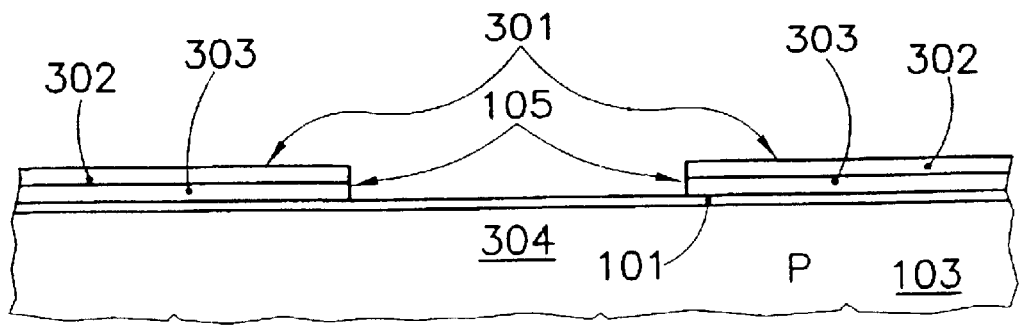

With reference to FIG. 4A, after having formed the silicon dioxide layer 101 on the surface of the semiconductor substrate 103 and having formed the layer 105 of silicon nitride on the oxide layer 101, the first etch mask 301 (visible in FIG. 3G) is formed on the nitride layer 105, and an etch process is carried out, to form the stripes 303 of silicon nitride.

Figure 4B:
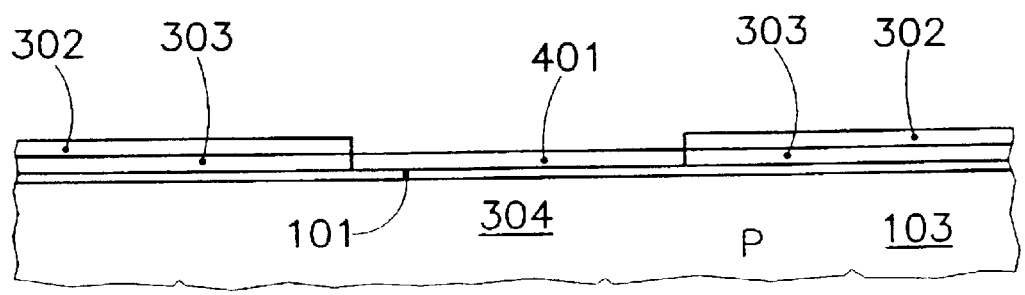

Referring to FIG. 4B, a layer 401 of silicon dioxide is formed on the silicon dioxide layer 101 over the central channel substrate regions 304. Just as discussed in connection with the second embodiment, the silicon dioxide layer 401 increases the thickness of the silicon dioxide layer 101 over the substrate 304. In this way, the electric field which develops in the memory cell programming phase in correspondence of the central channel region is reduced, and is instead increased in correspondence of the memory cell drain region, so that the localization of the injected charges is improved.

Figure 4C:
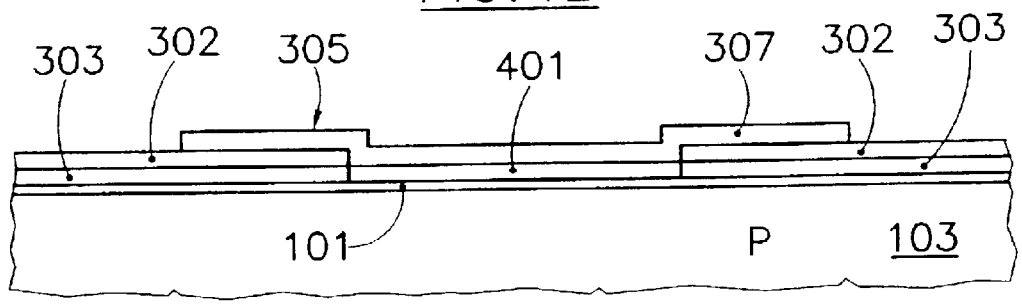

As depicted in FIG. 4C, the second etch mask 305 is formed.

Figure 4D:
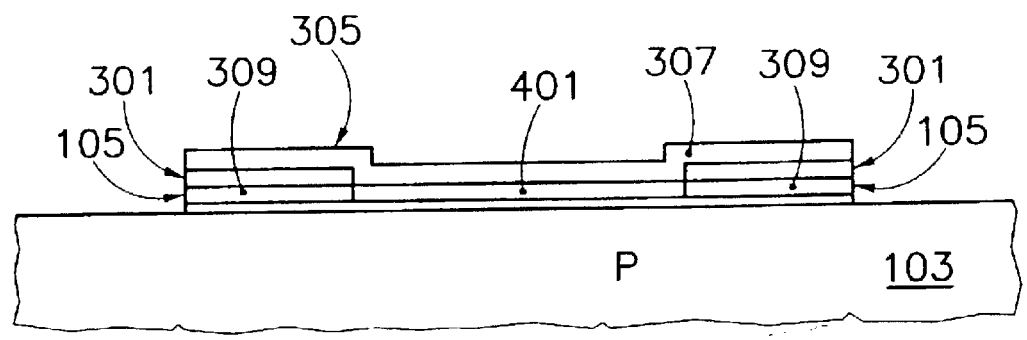

Coming to FIG. 4D, an etch process is then carried out to remove the first etch mask 301 and the nitride layer 105, where the latter are not protected by the second etch mask 305. The narrower nitride stripes 309 are thus formed.

Figure 4E:
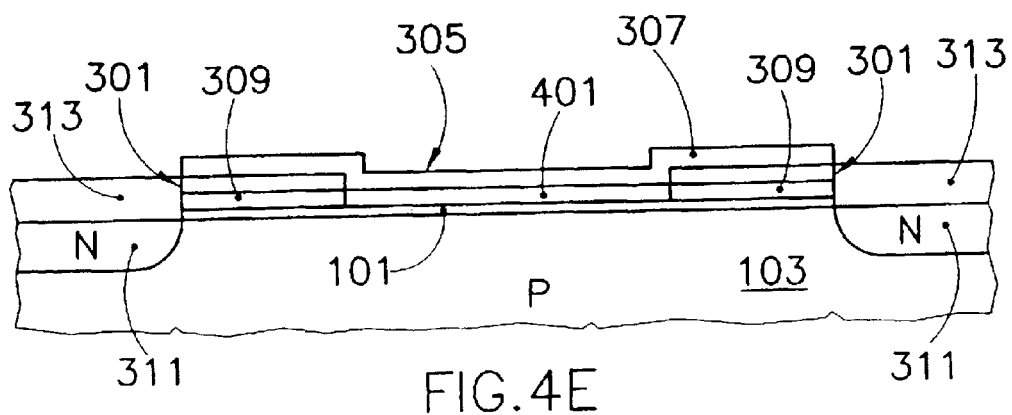

Referring to FIG. 4E, an N type dopant is then implanted into the substrate 103 exploiting the second etch mask 305 as an implant mask for the dopants. The central channel substrate regions 304 are protected against the introduction of dopants, while the N type regions 311 are formed between alternate adjacent pairs of narrower nitride stripes 309. The layer 313 of silicon dioxide is then formed over the N type regions 311.

Figure 4F:
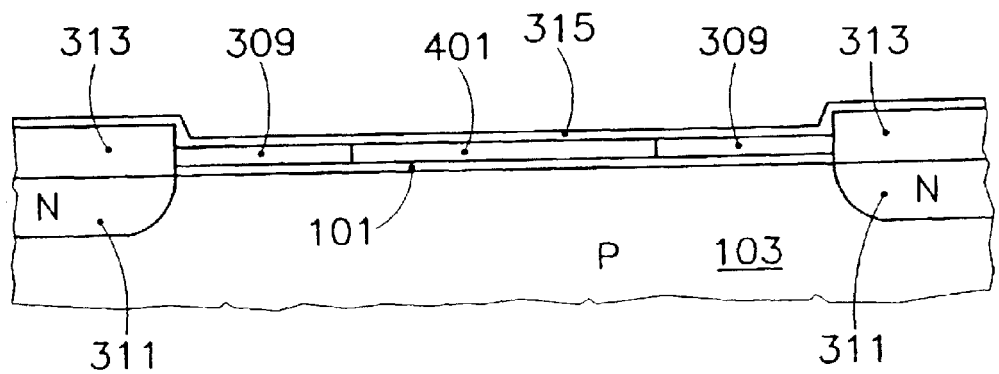

As depicted in FIG. 4F, the first and second etch masks 301 and 305 are removed, and the layer 315 of silicon dioxide is formed over the structure, to complete the ONO sandwich.

Figure 4G:
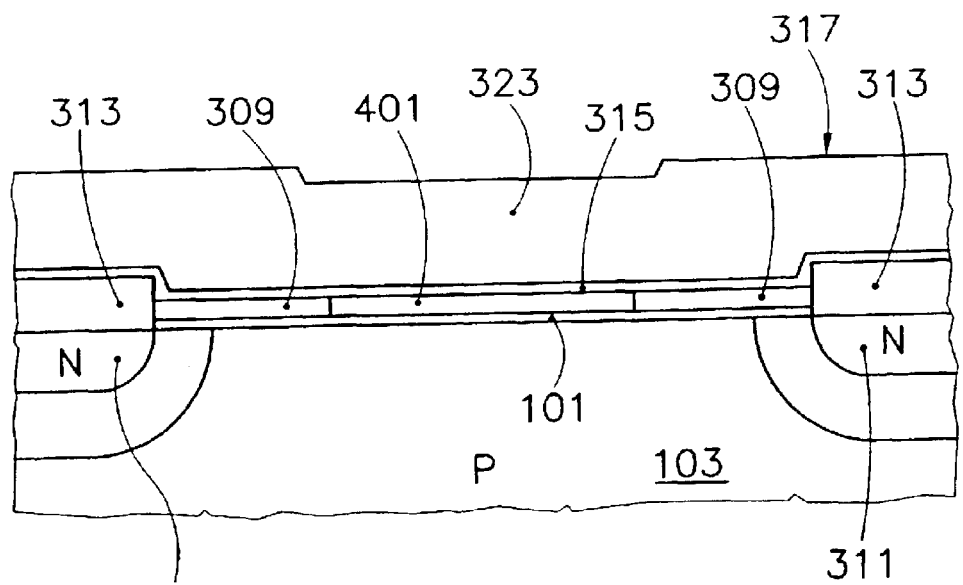

Finally, with reference to FIG. 4G, the layer 317 of polysilicon is formed over the silicon dioxide layer 315, the third etch mask 319 shown in FIG. 3G is formed over the polysilicon layer 317 and an etch process is carried out to define the plurality of polysilicon stripes 323 constituting the word lines of the memory cell array and, at the same time, the gates of the memory cells.

The process according to the fourth embodiment allows to obtain memory cells as compact as those obtainable by means of the process according to the third embodiment. In addition to this, and similarly to the process according to the second embodiment, the oxide layer over the central channel region is thicker than in the third embodiment, so as to reduce the electrical field in correspondence of the central channel region, especially during the programming phase, and thus achieving a better localization of the injected charges near the edges of the nitride layer facing the bit lines.

Any one of the above-described processes can be straightforwardly combined with so-called triple-well CMOS manufacturing processes. By way of example only, FIG. 5 shows a cross-sectional view taken along a word line of an array of memory cells formed, by means of the process according to the fourth embodiment previously described, in a P type well 503 formed inside an N type well 502 in turn formed in a P type substrate 501. The provision of the triple well structure makes it feasible to implement polarization schemes that allow to exploit the CHISEL effect during programming, to reduce the current consumption and consequently increase the degree of parallelism in programming. By way of example, one of the two lateral transistors T1, T3 of a given memory cell can be sensed by keeping the P type well 503 and the memory cell source electrode (the bit line adjacent to the lateral transistor T1 or T3 to be sensed) at the reference voltage (ground), while applying positive voltages to the word line 323 and to the memory cell drain electrode (the bit line opposite to the lateral transistor to be sensed). In order to write one of the lateral transistor, the P type well 503 is kept to ground or biased at a negative voltage, the memory cell source electrode (the bit line opposite the lateral transistor to be programmed) is kept to ground, and sufficiently high positive voltages are applied to the word line 323 and to the memory cell drain electrode (the bit line adjacent the lateral transistor to be programmed). The lateral transistor can be erased by applying a negative voltage to the P type well 503, keeping the word line 323 grounded, and applying a sufficiently high positive voltage to the memory cell drain electrode (the bit line adjacent the lateral transistor to be erased), while floating the memory cell source electrode (the bit line opposite the lateral transistor to be erased).

Additionally, any one of the process embodiments according to the invention is also suitable for forming EEPROM cell arrays. Differently from an array of EPROM or Flash EPROM cells, in which pairs of adjacent memory cells belonging to a same word line share an N type region forming a bit line, in an EEPROM cell array adjacent memory cells belonging to a same word line cannot share a same bit line, to preserve the byte-erase capability. By way of example, FIG. 6 shows a cross-sectional view taken along a generic word line of an EEPROM array of cells obtained by means of the process according to the first embodiment described, combined with a triple-well CMOS process. The memory cells are formed inside a P type well 603, formed within an N type well 602 in turn formed in a P type substrate 601. Adjacent memory cells on a same word line are separated by insulation trenches 604, which are formed in the P type well 603 and extend parallel to the bit lines 117. The trenches 604 can be formed by conventional techniques before the formation of the first silicon dioxide layer 101.

The performance of the memory cells obtainable by means of the fabrication processes described so far may be limited by problems deriving from the extension of the depletion regions associated with the PN junctions formed by the bit line N type doped regions and the P type substrate or well wherein the memory cells are formed. The depletion region extension depends, as known, on the doping levels of the P type substrate or well and the N type bit lines, and on the potential applied thereto. It is to be observed that the doping level of the P type substrate or well affects the threshold voltage of the memory cells and cannot be made too high, while the N type bit lines have to be rather heavily doped, to reduce the resistively thereof. The depletion regions extend therefore more in the P type substrate or well than in the N type bit lines. This can pose problems when the memory cell dimensions are shrinked.

A possible improvement consists in locally increasing the doping level of the P type substrate or well, in correspondence of the N type bit lines, without significantly affecting the doping level under the ONO sandwich portions and in the central channel region of the memory cells.

One way to achieve such a result is shown in FIGS. 7A to 7D, which are cross-sectional views of a portion of an array of memory cells showing the main steps of a fabrication process according to a further embodiment of the present invention.

With reference to FIG. 7A, similarly to the third embodiment previously described, after having formed the silicon dioxide layer 101 on the surface of the semiconductor substrate 103 and having formed the layer 105 of silicon nitride on the oxide layer 101, the first etch mask 301 (depicted in FIG. 3G) is formed on the nitride layer 105, and an etch process is carried out, to form the stripes 303 of silicon nitride.

Referring to FIG. 7B, a second etch mask 701 is formed. The second etch mask 701 has a layout identical to that of the second etch mask 305 depicted in FIG. 3G, comprising a plurality of stripes 702 identical to the second etch mask stripes 307. The difference resides in the thickness of the second etch mask 701, as will be explained later on. An etch process is then carried out to remove the first etch mask 301 and the nitride layer 105, where the latter are not protected by the second etch mask 305. The narrower nitride stripes 309 are thus formed.

Figure 7C:
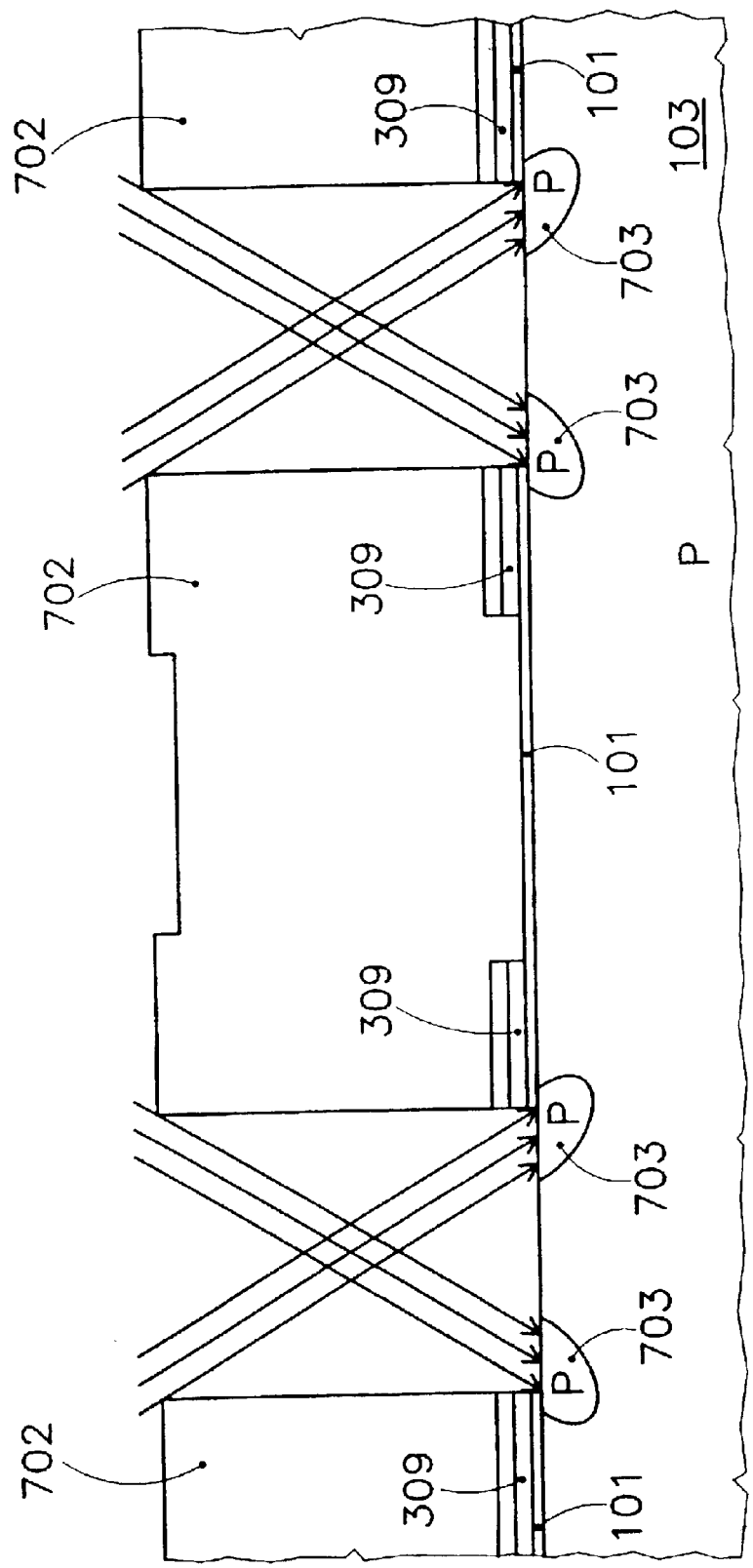

Reference is now made to FIG. 7C. The thickness of the etch mask 701 is chosen with accuracy in such a way as to allow the formation of P type pockets 703, more heavily doped than the P type substrate 103, in substrate regions where the N type bit lines will be formed, by means of tilted implants of P type dopants. In particular, by carefully choosing the thickness of the second etch mask 702 and the tilt angle of the implants, it is possible to form in the substrate 103 the P type pockets 703 near the outer edges of the narrower nitride stripes 309, and partially extending thereunder.

Figure 7D:
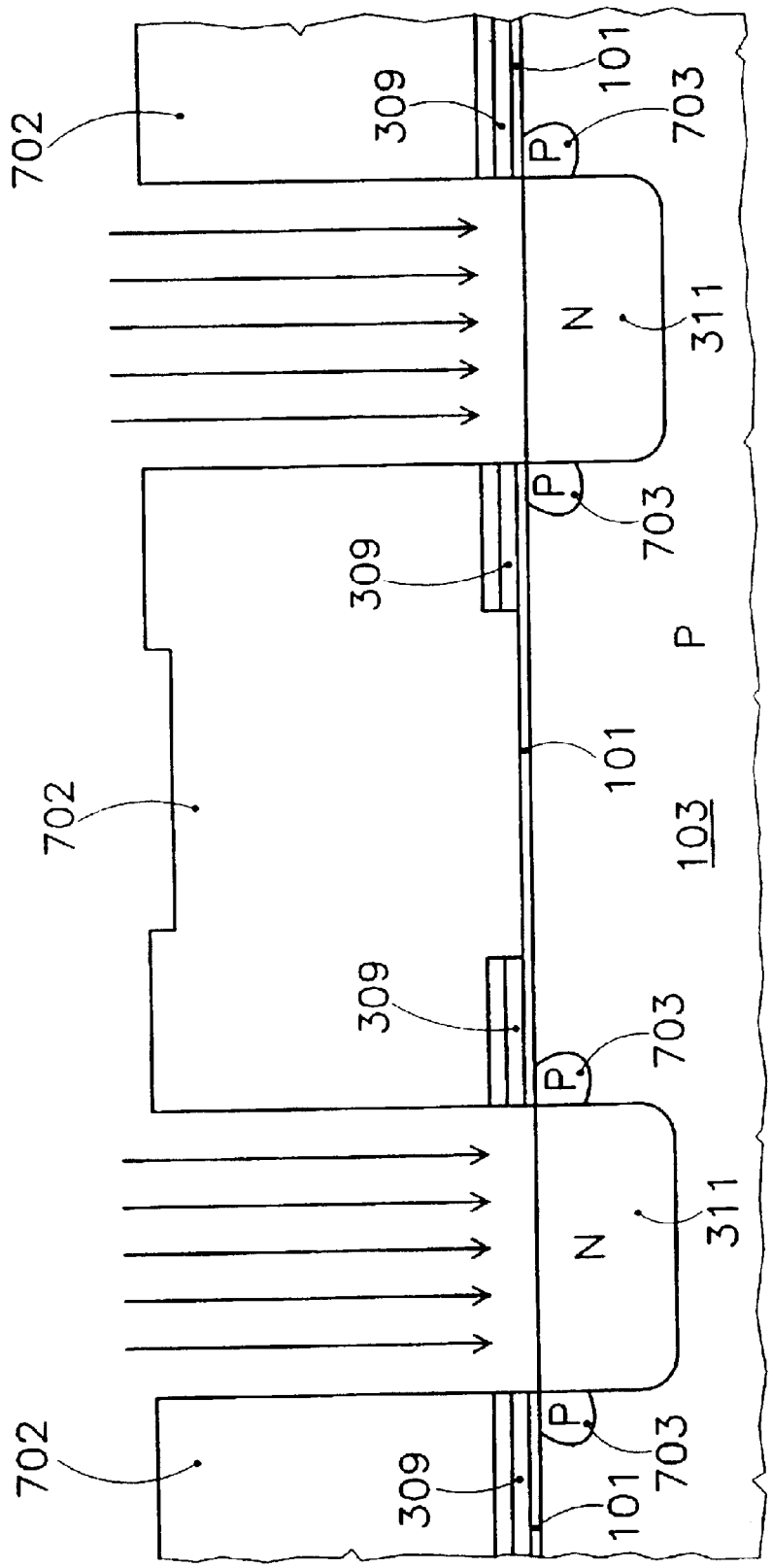

Referring to FIG. 7D, an N type dopant is then implanted into the substrate 103 orthogonally to the surface thereof, exploiting the second etch mask 305 as an implant mask for the dopants. The N type regions 311 are thus formed between alternate adjacent pairs of narrower nitride stripes 309.

The process goes on with steps similar to those described in connection to the third embodiment.

The tilted implant of the P type dopants for the formation of the P type pockets 703 may as well be performed after the implant of the N type dopants for the formation of the N type bit lines 311.

The presence of the P type pockets 703, increasing the doping level of the substrate 103 at the boundary of the bit lines, reduces the extension of the depletion regions inside the substrate.

Albeit described in association with the third process embodiment, the tilted-implant technique can be used in association with any of the four process embodiments previously described, and can be applied as well to the manufacturing of the array of EEPROM cells, so as to form P type pockets shown in dash-and-dot lines and indicated by 605 in FIG. 6.

Also, other techniques can be used to increase locally the doping level of the substrate or well within which the memory cells are formed.

The fabrication processes according to the present invention allow to obtain dual charge storage location memory cells in which the two charge storage locations of each memory cell are physically separated from each other. In this way, the problem of having electric charge trapped in the nitride layer at the center of the channel region is overcome, since no nitride layer exist in correspondence of that channel region. The charges injected into and trapped in the nitride layer are therefore intrinsically localized in proximity of the memory cell source/drain regions, where they can be relatively easily removed.

The memory cells are thus not subjected to a fast aging caused by the presence of charges trapped in regions of the nitride layer where they can hardly be removed. The memory cells can be submitted to a high number of program/erase cycles.

Also, it is possible to exploit the beneficial CHISEL effect to reduce the currents need to program the memory cells, and thus to increase the degree of parallelism.

For the same reason, no problems of redistribution of the injected charge are encountered.

Thanks to the localization of the injected charges in the two physically separated charge storage locations, less charges need to be injected in order to achieve a target threshold voltage shift. This fact, in conjunction with the fact that the injected charges remain localized near the memory cell source/drain regions, improves the efficiency of the charge carrier recombination mechanism during the erase operation.

For the above reasons, the distributions of threshold voltage values are rather narrow: a lower threshold voltage shift is thus sufficient to guarantee the discrimination between an erased and a written bit. Thanks to this, small amount of charges need to be injected to achieve the desired threshold voltage shift, which reduces the memory cell aging.

Also, relatively low drain voltages are needed to program the memory cells, thus reducing the soft-erase effect induced on memory cells belonging to a same column of the array.

The physical separation of the two charge storage locations strongly reduces the influence of the charges injected into one charge storage location on the other one. The operating area, in terms of threshold voltage values, is consequently increased. In conjunction with the fact that even a small threshold voltage shift can be discriminate, this allows to allocate more than two threshold voltage levels, thus making it possible to implement multi-level approaches.

The process according to an embodiment of the present invention is relatively simple, requires only one layer of polysilicon and does not involve any potentially critical step; for example, differently from the processes described in U.S. Pat. No. 6,248,633 B1, no disposable polysilicon sidewall spacers are used.

The memory cells obtained by means of the process according to an embodiment of the present invention are rather compact.

In particular, the process according to an embodiment of the present invention is suitable for forming contact-less arrays of memory cells.

Although the present invention has been disclosed and described by way of some embodiments, it is apparent to those skilled in the art that several modifications to the described embodiments, as well as other embodiments of the present invention are possible without departing from the scope thereof as defined in the appended claims.

For example, although in the present description reference has always been made to ONO sandwiches, this is not to be considered a limitation for the present invention. Other types of materials may in fact be used. For example, the silicon nitride layer may be substituted for by a different charge trapping dielectric material. Also, one or both of the silicon dioxide layers forming the bottom and top layers of the ONO sandwich may be substituted for by different dielectrics, particularly high-k (i.e., high dielectric constant) dielectrics such as the promising $ZrO_2$ and $HfO_2$.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

I claim:

1. A dual charge storage location, electrically programmable memory cell, comprising:
    two spaced-apart doped regions formed in a semiconductor material, defining therebetween a memory cell channel region;
    two physically-separated charge storage elements placed over the channel region, each charge storage element being adjacent to, without extending over, a respective one of the two doped regions, a central portion of the channel region extending between the charge storage elements being free of charge storage elements, wherein the charge storage elements are composed of silicon nitride; and
    a single polysilicon layer control gate extending along the channel region insulatively over the two charge storage elements and the central portion of the channel region.

2. The memory cell according to claim 1, in which a distance between the two charge storage elements is equal to a technological minimum feature size.

3. The memory cell according to claim 1, further comprising a central dielectric layer positioned between the charge storage elements and on the central portion of the channel region.

4. The memory cell of claim 1 wherein the doped regions are aligned with respective edges of the charge storage elements.

5. The memory cell of claim 1, further comprising a gate dielectric layer underlying the charge storage elements and overlying the channel region.

6. The memory cell of claim 1 wherein the semiconductor material is a semiconductor wafer substrate.

7. The memory cell of claim 1 wherein the semiconductor material is a first well of a first conductivity type formed within a second well of a second conductivity type, in turn formed within a semiconductor wafer substrate of the first conductivity type.

8. The memory cell of claim 1, further comprising:
    a first gate dielectric layer underlying the charge storage elements and overlying the channel region;
    a second gate dielectric layer positioned on the first gate dielectric layer and between the charge storage elements without extending on the charge storage elements; and
    a third gate dielectric layer positioned on the second gate dielectric layer and between the charge storage elements and the single polysilicon layer control gate.

9. The memory cell of claim 1, wherein the channel region has a first conductivity type and the two spaced-apart doped regions have a second conductivity type opposite to the first conductivity type, the memory cell further comprising:
    two additional spaced-apart doped regions of the first conductivity type positioned between and adjacent to the two spaced-apart doped regions, the two additional spaced-apart doped regions having a higher doping level than the channel region which separates the two additional spaced-apart doped regions from each other.

10. A dual charge storage, electrically programmable memory cell, comprising:

a semiconductor layer of a first conductivity type;

first and second doped regions spaced apart from each other in the semiconductor layer, the doped regions being of a second conductivity type;

first and second charge storage regions spaced apart from each other above the semiconductor layer and positioned adjacent to the first and second doped regions, respectively, wherein the charge storage regions are physically separated and composed of silicon nitride;

a central dielectric layer positioned between, without extending on, the first and second charge storage regions;

a conductive control gate positioned over the central dielectric layer and the first and second charge storage regions, and being insulated from the first and second charge storage regions;

a first gate dielectric layer underlying the charge storage regions and the central dielectric layer and positioned on the channel region; and a second gate dielectric layer positioned on the central dielectric layer and between the charge storage regions and the conductive control gate.

11. The memory cell of claim 10 wherein the first and second doped regions are aligned with respective edges of the first and second charge storage regions, respectively.

12. The memory cell of claim 10, further comprising a gate dielectric layer underlying the central dielectric layer and the charge storage regions.

13. The memory cell of claim 10 wherein the semiconductor layer is a semiconductor wafer substrate.

14. The memory cell of claim 10 wherein the semiconductor layer is a first well formed within a second well of the second conductivity type, in turn formed within a semiconductor wafer substrate of the first conductivity type.

15. The memory cell of claim 10, further comprising:

third and fourth doped regions of the first conductivity type positioned between and adjacent to the first and second doped regions, respective, the third and fourth doped regions having a higher doping level than the channel region which separates the third and fourth doped regions from each other.

* * * * *

UNITED STATES PATENT AND TRADEMARK OFFICE
CERTIFICATE OF CORRECTION

PATENT NO. : 6,958,510 B2  Page 1 of 1
DATED : October 25, 2005
INVENTOR(S) : Luigi Pascucci It is certified that error appears in the above-identified patent and that said Letters Patent is hereby corrected as shown below:

Column 14,
Line 36, "respecetive edges" should read -- respective edges --.

Signed and Sealed this

Twenty-fourth Day of January, 2006

JON W. DUDAS
*Director of the United States Patent and Trademark Office*